United States Patent [19]

Dil

[11] Patent Number: 4,603,340
[45] Date of Patent: Jul. 29, 1986

[54] SEMICONDUCTOR DEVICE HAVING SUPERLATTICE STRUCTURE

[75] Inventor: Jan G. Dil, Eindhoven, Netherlands

[73] Assignee: U.S. Philips Corporation, New York, N.Y.

[21] Appl. No.: 607,904

[22] Filed: May 7, 1984

[30] Foreign Application Priority Data

May 17, 1983 [NL] Netherlands ............... 8301745

[51] Int. Cl.⁴ ............................................ H01L 27/12
[52] U.S. Cl. ........................................ 357/4; 357/16; 357/17
[58] Field of Search ................... 357/4 SL, 4, 16, 17

[56] References Cited

U.S. PATENT DOCUMENTS 3,626,257 12/1971 Esaki et al. ............... 357/4 SL
4,261,771 4/1981 Dingle et al. ............. 357/4 SL Primary Examiner—Martin H. Edlow
Attorney, Agent, or Firm—Robert T. Mayer; Steven R. Biren

[57] ABSTRACT

When two indirect only slightly different semiconductor materials having a suitable band gap, for example, AlAs and $Al_{0.8}Ga_{0.2}As$, are grown epitaxially one onto the other in layers of a few unit cell layers thick, the electronic band structures are folded so that the indirect minimum of the conduction band is displaced from the edge of the Brillouin zone to the center. The two indirect materials then constitute a superlattice with a band transition with a band gap of 2.2 eV.

7 Claims, 9 Drawing Figures

SEMICONDUCTOR DEVICE HAVING SUPERLATTICE STRUCTURE

BACKGROUND OF THE INVENTION

The invention relates to a semiconductor device comprising a semiconductor body provided with a superlattice which alternately comprises layers of an indirect semiconductor material $A^{III}$-$B^V$ and layers of a mixed crystal (alloy) of the same material in which one of the elements A and B is replaced in part by an equivalent element C, the superlattice exhibiting at least in a direction at right angles to the interfaces between the layers a direct band transition due to zone folding.

As is known, the term "direct transition" is used when in the K space the minimum of the conduction band lies above the maximum of the valence band (Γ point). When these extreme values are relatively displaced, the transition is indirect. Direct transitions are more particularly (but not exclusively) of importance for semiconductor lasers. In the case of a direct transition, the interaction electron—photon is a two-particle problem, as a result of which the transition probability of the transition of an electron from a high to a low level is comparatively high. In the case of an indirect transition, this transition probability is determined by a three-particle interaction (electron—photon—phonon) and is consequently generally so low that materials having such a transition cannot be used for lasers.

The most generally known and most frequently used semiconductor material for lasers is GaAs, which exhibits a direct transition. In the case of a band gap of 1.42 eV, radiation in the infrared is emitted by the GaAs. However, radiation of a shorter wavelength is desirable for many applications. When a fraction X of the Ga is replaced by Al, it is possible to reduce in GaAs the wavelength down to the red (nearly infrared) range. Since the fraction X is bounded by a limit value (0.45), above which the material exhibits an indirect band transition, such as pure AlAs, this method is not suitable to obtain small wavelengths. AlAs has in itself a suitable band gap (2 eV, corresponding to $\lambda \approx 590$ nm in vacuo), but has an indirect band transition.

In the article "A $GaAs_xP_{1-x}/GaP$ strained layer superlattice" by G. C. Osbourn et al in Appl. Phys. Lett. 41 (2), July 15, 1982, pages 172/174, there is described a superlattice alternately comprising 60 nm thick layers of $GaAs_xP_{1-x}$ and 60 nm thick layers of GaP, which materials are both indirect in themselves. Due to the superlattice configuration, a direct transition can be obtained by zone folding, as indicated in the aforementioned publication. The aforementioned materials are chosen so that due to the difference in lattice constants and the strain in the crystal lattice caused thereby, variations occur in the energy bands. Such a configuration has the disadvantage that both during and after the epitaxial growth of the layers defects are liable to be introduced into the crystal lattice.

SUMMARY OF THE INVENTION

The present invention has for its object inter alia to provide a semiconductor device having a superlattice structure, in which by zone folding a direct transition is present, which semiconductor device can be manufactured in a simple manner.

According to the invention, such a semiconductor device is characterized in that the element C mentioned above and the concentration thereof are chosen so that the layers have substantially equal lattice constants at least in a direction parallel to the interfaces and in that the sum of the thicknesses of two successive layers in the superlattice is at most about 5.0 nm.

Due to the fact that the lattice constants of the various layers are substantially equal to each other, it becomes considerably simpler to apply the layers while avoiding lattice defects. The sum of the thicknesses of two successive layers is at most about 10 unit cells.

An important preferred embodiment is characterized in that the first layers are made of AlAs and the second layers are made of $Al_{1-x}Ga_xAs$, where $0 < x \leq 0.45$.

BRIEF DESCRIPTION OF THE DRAWING

The invention will be described more fully with reference to several embodiments and the accompanying diagrammatic drawing, in which:

FIG. 3 shows the band structure of AlAs, of which

FIG. 5 and FIG. 7 show band structures of superlattices, of which

DESCRIPTION OF THE PREFERRED EMBODIMENTS

Figure 1:
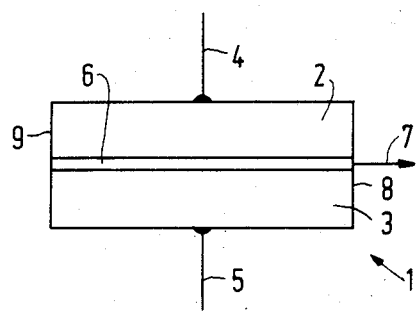
FIG. 1 is a cross-section of a semiconductor laser according to the invention.

FIG. 1 shows diagrammatically a cross-section of a semiconductor laser according to the invention comprising a semiconductor body 1 having two regions 2 and 3 of opposite conductivity types. These regions are provided with connections 4 and 5, respectively, for supplying electric current. Between the regions 2 and 3 there is defined an active layer 6 for producing or amplifying electro-magnetic radiation, which is indicated diagrammatically by the arrow 7. The resonator may be constituted, as is usual with semiconductor lasers, by the side faces 8 and 9 of the semiconductor body.

Figure 2:
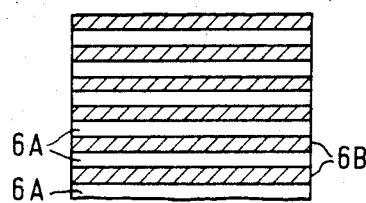
FIG. 2 shows on an enlarged scale a part of the device shown in FIG. 1.

FIG. 2 shows on an enlarged scale a part of the active layer 6. This layer is not uniform, but is constituted by a superlattice comprising a large number of sublayers 6A and 6B. The sublayers 6A, which are shown by non-shaded areas, are made in the present embodiment of AlAs, while the layers 6B, which are shown by shaded areas, are made of a mixed crystal (alloy) having the composition $Al_{1-x}Ga_xAs$, where $0 < x \leq 0.45$, e.g. $x = 0.2$. In this composition, the mixed crystal has substantially the same lattice constant as AlAs so that the occurrence of stresses and strain in the superlattice is avoided. The thicknesses of the layers 6A and 6B are chosen so that the sum of the thicknesses of a sublayer 6A and an adjoining sublayer 6B is at most about 5 n.m. The layers 6A and 6B may be applied in a manner known per se, for example, by means of MBE (Molecular Beam Epitaxy).

Figure 3:
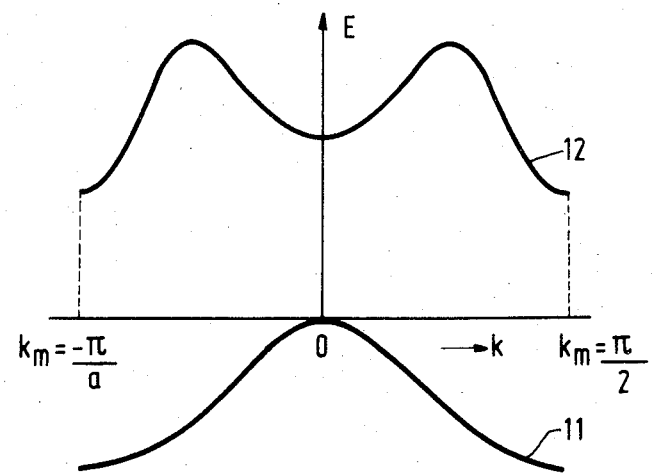
Figure 4:
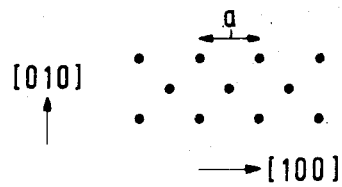
FIG. 4 shows diagrammatically the crystal structure.
Figure 5:
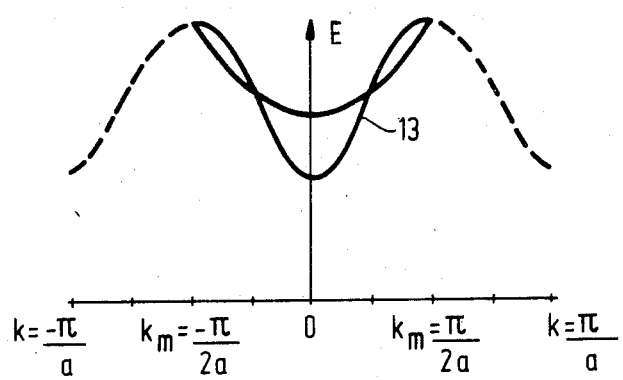

The manner in which a direct band-to-band transition can be obtained by means of such a superlattice—although AlAs and $Al_{1-x}Ga_xAs$ are both indirect—will be explained with reference to FIGS. 3-5. In FIG. 4, the crystal lattice of pure AlAs is shown diagrammatically in the [100] and the [010] direction. Each dot represents a unit cell. FIG. 3 shows the band diagram for pure AlAs. The K vector is plotted on the abscissa and the energy (in eV) is plotted on the ordinate. The drawing shows the first Brillouin zone for the valency band 11 and the conduction band 12. The Brillouin zone is limited by the dots $k_m = +\pi/a$ and $k_m = -\pi/a$, where a is the lattice constant. The valency band 11 has a maximum at $k=0$, that is to say at the center of the Brillouin zone ($\Gamma$ point). The conduction band has a minimum at the edge of the Brillouin zone at an energy of about 2.2 eV. In the $\Gamma$ point, the energy of the conduction band is about 2.8 eV.

Figure 6:
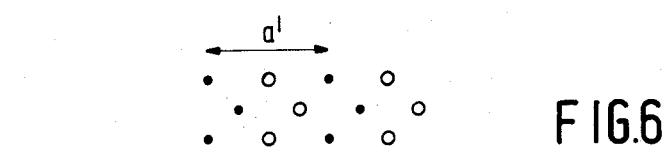
FIG. 6 and FIG. 8 show diagrammatically the crystal structures.

FIG. 6 shows (diagrammatically) the crystal structure of a superlattice according to the invention. The black dots represent again unit cells of AlAs (sublayers 6A), while the white dots represent unit cells of $Al_{1-x}Ga_xAs$. In the diagram shown in FIG. 6, sublayers 6A having a thickness of (on an average) one unit cell layer of AlAs and sublayers 6B having a thickness of (on an average) one unit cell layer of $Al_{1-x}Ga_xAs$ are alternately applied (monomolecular sublayers). This configuration has a lattice constant a which is about twice the original lattice constant of AlAs. The edges of the Brillouin zone are now located at $k_m = (\pi/2a)$ and $k_m = -(\pi/2a)$ (see FIG. 5). The parts of the Brillouin zone in FIG. 3, which are located between $\pi/a$ and $\pi/2a$ and between $-\pi/a$ and $-\pi/2a$ and are indicated in FIG. 5 by dotted lines (of the conduction band), are bent or folded inwards, as indicated by the curve 13. The minimum of the conduction band at 2.2 eV at the edge of the original Brillouin zone is now displaced to the center of the Brillouin zone in $k=0$. The valence band, which is no longer shown in FIG. 5 because the maximum does not change its place, is folded in the same manner. Due to this zone folding, the minimum of the conduction band is located above the maximum of the valence band. The material has now become direct, which means that transitions between conduction band and valence band without phonon exchange are possible.

Figure 7:
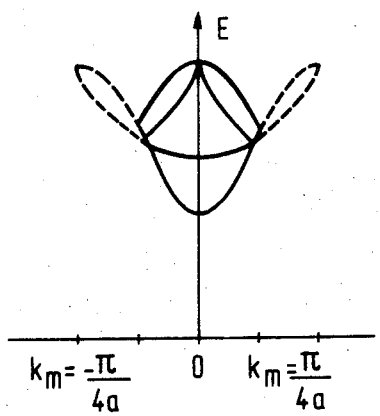
Figure 8A:
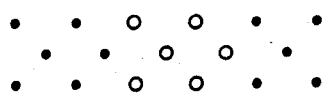
Figure 8B:
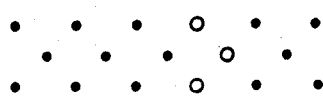

FIG. 8 shows a variation of the method described here of obtaining a direct transition in AlAs. The period in the crystal is in this case not doubled, but quadrupled in that each time a layer of two unit cell layers of AlAs alternates with two unit cell layers of $Al_{1-x}Ga_xAs$, as shown in FIG. 8a. The minimum of the conduction band remains located, as the maximum of the valence band, at the $\Gamma$ point. The edges of the Brillouin zone are located at $k_m = (\pi/4a)$ and $k_m = -(\pi/4a)$. The parts of the curve in FIG. 5, which are located outside the Brillouin zone, are again folded inwards, as a result of which the band structure shown in FIG. 7 is obtained. FIG. 8b shows a different method of obtaining the band structure shown in FIG. 7, in which sublayers 6A of three unit cell layers of AlAs alternate with sublayers 6B of one unit cell layer of $Al_{1-x}Ga_xAs$. The minimum of the conduction band remains located above the maximum of the valence band so that direct transitions with $\Delta K = 0$ are possible.

The lattice constant a of the materials used here is $5.66 \cdot 10^{-1}$ nm. With an overall thickness of about 5 nm, the overall number of elementary cell layers in the superlattice is at most about 10. Such sublayers have great advantages with respect to thicker layers. On the one hand it is possible to make the number of subcells in the superlattice very large because for a band structure a very large number of (enlarged) unit cells is required. When this number is too small, the energy bands can be subdivided into discrete levels as is the case, for example, in the quantum well laser. On the other hand, local band structures are not defined in the subcells of the superlattice. Moreover, in increasingly larger subcells in the superlattice, the already large effective mass of electrons in the originally indirect minimum can become even larger by opening band transitions at the edge of the Brillouin subzone.

In addition to lasers, the superlattice structure suggested here may also be used for other applications, such as transistors. Further, superlattices may be manufactured using other $A^{III}B^V$ materials than the AlAs described here.

With the aid of the superlattice structure described here, so-called "Quantum well lasers" may also be manufactured, in which a number of thin activelayers of the configuration described here and intermediate barrier layers are alternately applied.

What is claimed is:

1. A semiconductor device comprising a semiconductor body provided with a superlattice configuration which alternately comprises first layers of an indirect semiconductor material $A^{III}\text{-}B^V$ and second layers of a mixed crystal (alloy) of the same material, in which one of the elements A and B is partly replaced by an equivalent element C, in which the superlattice exhibits at least in a direction at right angles to the interfaces between the layers a direct band transition due to zone folding, the element C and the concentration thereof being chosen so that the layers have substantially equal lattice constants at least in a direction parallel to the interfaces and the sum of the thicknesses of two successive layers in the superlattice being at most about 5.0 nm.

2. A semiconductor device as claimed in claim 1, characterized in that the layers are constituted by layers each having a thickness of one unit cell layer.

3. A semiconductor device as claimed in claim 1, characterized in that the layers each have a thickness of two unit cell layers.

4. A semiconductor device as claimed in claim 1, characterized in that the first layers have a layer thickness of three unit cell layers and the second layers have a thickness of one unit cell layer.

5. A semiconductor device as claimed in claim 1, 2, 3 or 4, characterized in that the first layers comprise AlAs and the second layers comprise $Al_{1-x}Ga_xAs$, where $0 < x < 0.45$.

6. A semiconductor device as claimed in claim 1, 2, 3 or 4, characterized in that the superlattice comprises the active layer of a semiconductor laser.

7. A semiconductor device as claimed in claim 6, characterized in that the laser comprises a quantum well laser comprising alternately a number of thin active layers and barrier layers, the active layers each having said superlattice configuration.

* * * * *